(12) United States Patent
Lu

(10) Patent No.: US 10,644,378 B1
(45) Date of Patent: May 5, 2020

(54) ELECTRONIC DEVICE

(71) Applicants: Wistron NeWeb Corp., Hsinchu (TW); WebCom Communication (Kunshan) Corporation, KunShan, Jiangsu Province (CN)

(72) Inventor: Tzu-Li Lu, Hsinchu (TW)

(73) Assignees: WISTRON NEWEB CORP., Hsinchu (TW); WEBCOM COMMUNICATION (KUNSHAN) CORPORATION, Kunshan, Jiangsu Province (CN)

(*) Notice: Subject to any disclaimer, the term of this patent is extended or adjusted under 35 U.S.C. 154(b) by 0 days.

(21) Appl. No.: 16/282,561

(22) Filed: Feb. 22, 2019

(30) Foreign Application Priority Data

Dec. 27, 2018 (CN) .......................... 2018 1 1610916

(51) Int. Cl.
G06K 19/07 (2006.01)
H01Q 1/24 (2006.01)
H03F 1/26 (2006.01)
H05B 45/00 (2020.01)

(52) U.S. Cl.
CPC ........... *H01Q 1/24* (2013.01); *G06K 19/0723* (2013.01); *H03F 1/26* (2013.01); *H05B 45/00* (2020.01)

(58) Field of Classification Search
CPC ........ H01Q 1/24; H05B 33/0806; H03F 1/26; G06K 19/0723
See application file for complete search history.

(56) References Cited

U.S. PATENT DOCUMENTS

| | | | |
|---|---|---|---|
| 10,178,734 B1* | 1/2019 | Moumen | H05B 45/50 |
| 2004/0075501 A1* | 4/2004 | Takahashi | H03G 3/3047 |
| | | | 330/279 |
| 2004/0240404 A1* | 12/2004 | Ibrahim | H04L 1/1642 |
| | | | 370/312 |
| 2006/0217094 A1* | 9/2006 | Ikeda | H03G 3/3052 |
| | | | 330/129 |
| 2017/0146591 A1* | 5/2017 | Nobbe | G01R 31/28 |
| 2019/0036330 A1* | 1/2019 | Becker | H02H 3/385 |

FOREIGN PATENT DOCUMENTS

CN 106374422 A 2/2017
TW I256782 B 6/2006

* cited by examiner

*Primary Examiner* — Joseph E Dean, Jr.
(74) *Attorney, Agent, or Firm* — McClure, Qualey & Rodack, LLP

(57) ABSTRACT

An electronic device for detecting an antenna element includes a sensing circuit, a comparison circuit, an interface circuit, an internal LNA (Low Noise Amplifier), a bypass path, and a selection circuit. The sensing circuit generates a sensing voltage according to an input current. The input current is relative to the antenna element. The comparison circuit compares the sensing voltage with a first reference voltage, so as to generate a first control voltage. The sensing circuit is coupled through the interface circuit to an RF (Radio Frequency) node. The interface circuit is configured to reduce the interference between the antenna element and the electronic device. The selection circuit selectively couples the internal LNA or the bypass path to the RF node according to the first control voltage.

18 Claims, 8 Drawing Sheets

291

292

293

ELECTRONIC DEVICE

CROSS REFERENCE TO RELATED APPLICATIONS

This application claims priority of China Patent Application No. 201811610916.3 filed on Dec. 27, 2018, the entirety of which is incorporated by reference herein.

BACKGROUND OF THE INVENTION

Field of the Invention

The disclosure generally relates to an electronic device, and more particularly, it relates to an electronic device for automatically detecting antenna types.

Description of the Related Art

With the advancements being made in mobile communication technology, mobile devices such as portable computers, mobile phones, multimedia players, and other hybrid functional portable electronic devices have become more common. To satisfy user demand, mobile devices can usually perform wireless communication functions. Some devices cover a large wireless communication area; these include mobile phones using 2G, 3G, and LTE (Long Term Evolution) systems and using frequency bands of 700 MHz, 850 MHz, 900 MHz, 1800 MHz, 1900 MHz, 2100 MHz, 2300 MHz, 2500 MHz, and 2700 MHz. Some devices cover a small wireless communication area; these include mobile phones using Wi-Fi and Bluetooth systems and using frequency bands of 2.4 GHz, 5.2 GHz, and 5.8 GHz, or GPS (Global Positioning System) using operation frequency of 1575 MHz for communication.

Antennas are indispensable components of mobile devices supporting wireless communications. However, since external antenna elements have a variety of types, mobile devices coupled thereto cannot achieve the best communication performance. Accordingly, there is a need to propose a novel solution for solving the problems of the prior art.

BRIEF SUMMARY OF THE INVENTION

In an exemplary embodiment, the disclosure is directed to an electronic device for detecting an antenna element. The electronic device includes a sensing circuit, a comparison circuit, an interface circuit, an internal LNA (Low Noise Amplifier), a bypass path, and a selection circuit. The sensing circuit generates a sensing voltage according to an input current. The input current is relative to the antenna element. The comparison circuit compares the sensing voltage with a first reference voltage, so as to generate a first control voltage. The sensing circuit is coupled through the interface circuit to an RF (Radio Frequency) node. The interface circuit is configured to reduce the interference between the antenna element and the electronic device. The selection circuit selectively couples the internal LNA or the bypass path to the RF node according to the first control voltage.

In some embodiments, the amplifying circuit includes a first resistor, a second resistor, a third resistor, a first operational amplifier, a second operational amplifier, and a first transistor. The first resistor is coupled between a first node and a second node. The second resistor is coupled between a third node and a fourth node. The sensing resistor is coupled between the first node and the third node. The first operational amplifier has a positive input terminal coupled to the second node, a negative input terminal coupled to the fourth node, and an output terminal coupled to a fifth node. The first transistor has a control terminal coupled to the fifth node, a first terminal coupled to a sixth node, and a second terminal coupled to the second node. The third resistor is coupled between the sixth node and a ground voltage. The second operational amplifier has a positive input terminal coupled to the sixth node, a negative input terminal coupled to a seventh node, and an output terminal coupled to the seventh node for outputting the sensing voltage.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are shown in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
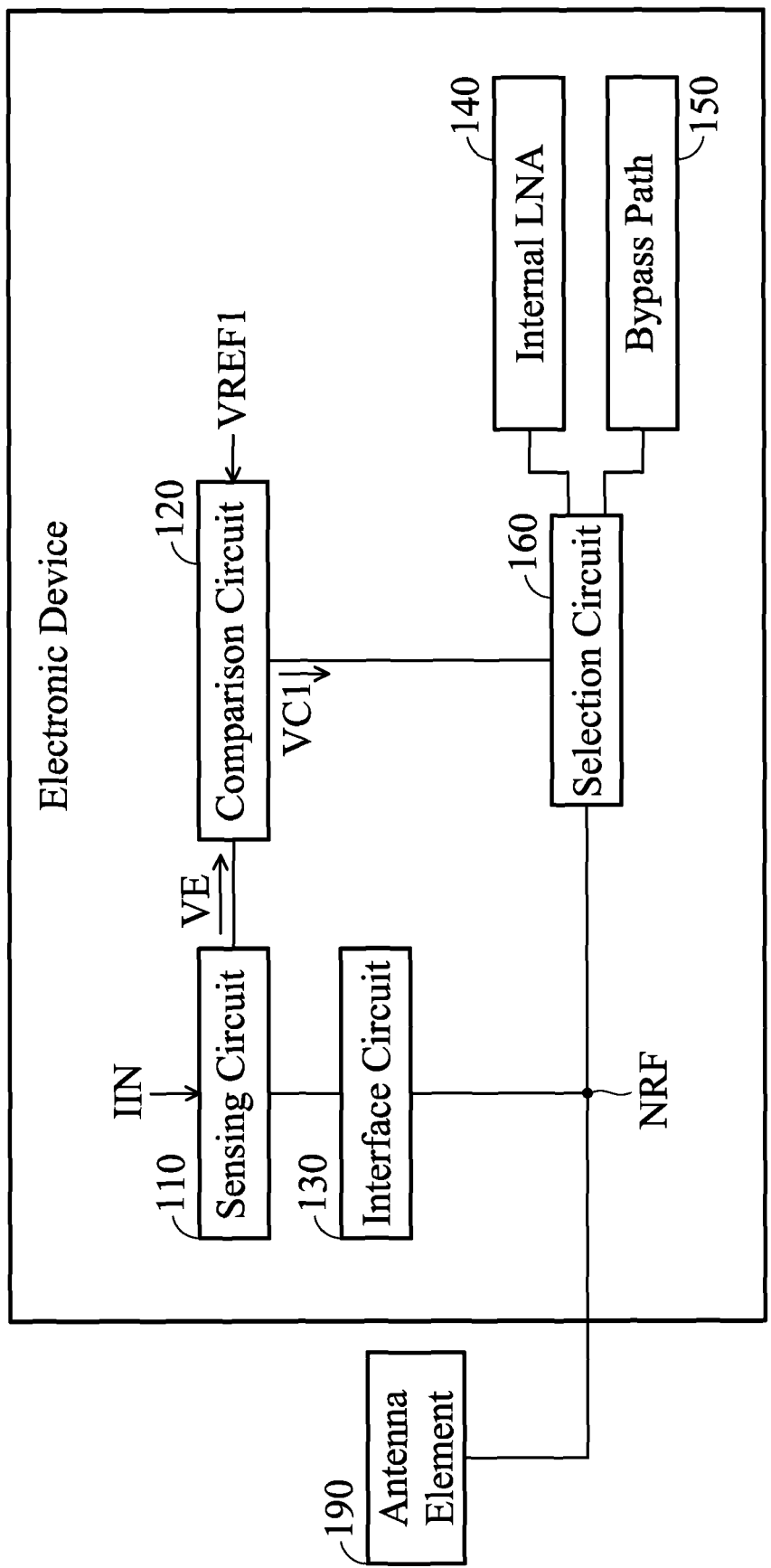
FIG. 1 is a diagram of an electronic device according to an embodiment of the invention.

FIG. 1 is a diagram of an electronic device 100 according to an embodiment of the invention. For example, the electronic device 100 may be an integrated circuit chip applied in a mobile device. For example, the electronic device 100 may be disposed in a wireless RF (Radio Frequency) module of the back end of the mobile device. The mobile device may be a smart phone, a tablet computer, or a notebook computer, but it is not limited thereto. The electronic device 100 can automatically detect the type of an antenna element 190 and thus perform corresponding operations. The antenna element 190 is coupled to an RF node NRF of the electronic device 100. For example, the antenna element 190 may be outside and independent of the electronic device 100, or may be disposed inside the electronic device 100. In some embodiments, the antenna element 190 covers a GPS (Global Positioning System) frequency band or an LTE (Long Term Evolution) frequency band. Specifically, the antenna element 190 may be classified into the following three types, as shown in the embodiments of FIGS. 2A, 2B and 2C.

Figure 2A:
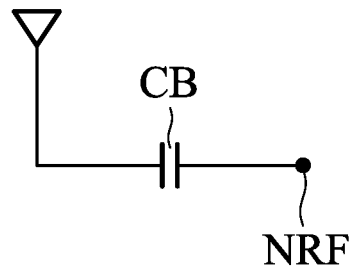
FIG. 2A is a diagram of an antenna element according to an embodiment of the invention.
Figure 2B:
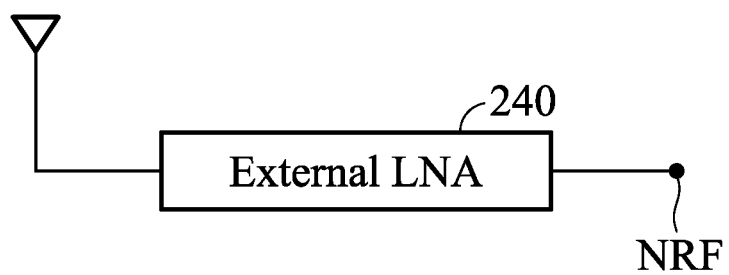
FIG. 2B is a diagram of an antenna element according to another embodiment of the invention.
Figure 2C:
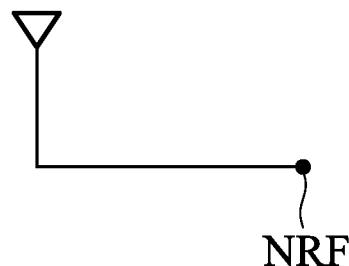
FIG. 2C is a diagram of an antenna element according to another embodiment of the invention.

FIG. 2A is a diagram of the antenna element 190 according to an embodiment of the invention. In the embodiment of FIG. 2A, the antenna element 190 is a passive antenna 291 including a DC (Direct Current) blocking capacitor CB, and it usually has a relatively small operating current. The DC blocking capacitor CB can prevent DC noise from entering the antenna body. FIG. 2B is a diagram of the antenna element 190 according to another embodiment of the invention. In the embodiment of FIG. 2B, the antenna element 190 is an active antenna 292 including an external LNA (Low Noise Amplifier) 240, and it usually has a relatively median operating current. FIG. 2C is a diagram of the antenna element 190 according to another embodiment of the invention. In the embodiment of FIG. 2C, the antenna element 190 is a passive antenna 293 without any DC blocking capacitor CB, and it usually has a relatively large operating current.

As shown in FIG. 1, the electronic device 100 at least includes a sensing circuit 110, a comparison circuit 120, an interface circuit 130, an internal LNA 140, a bypass path 150, and a selection circuit 160. The sensing circuit 110 generates a sensing voltage VE according to an input current IIN. The input current IIN is relative to the antenna element 190. For example, since the sensing circuit 110 is also coupled to the RF node NRF, the input current IIN may be directly or indirectly from the operating current of the antenna element 190. Alternatively, the input current TIN may be almost in proportion to the operating current of the antenna element 190. The comparison circuit 120 compares the sensing voltage VE with a first reference voltage VREF1, so as to generate a first control voltage VC1. The sensing circuit 110 is coupled through the interface circuit 130 to the RF node NRF. The interface circuit 130 is configured to reduce the interference between the antenna element 190 and the electronic device 100. The selection circuit 160 selectively couples either the internal LNA 140 or the bypass path 150 to the RF node NRF according to the first control voltage VC1. Generally, the electronic device 100 can detect the type of the antenna element 190, and then determine whether to use the internal LNA 140 according to the type of the antenna element 190, thereby optimizing the communication quality of the antenna element 190.

The following embodiments will introduce the detailed circuit design of the electronic device 100. It should be understood that these figures and descriptions are merely exemplary, rather than limitations of the invention.

Figure 3:
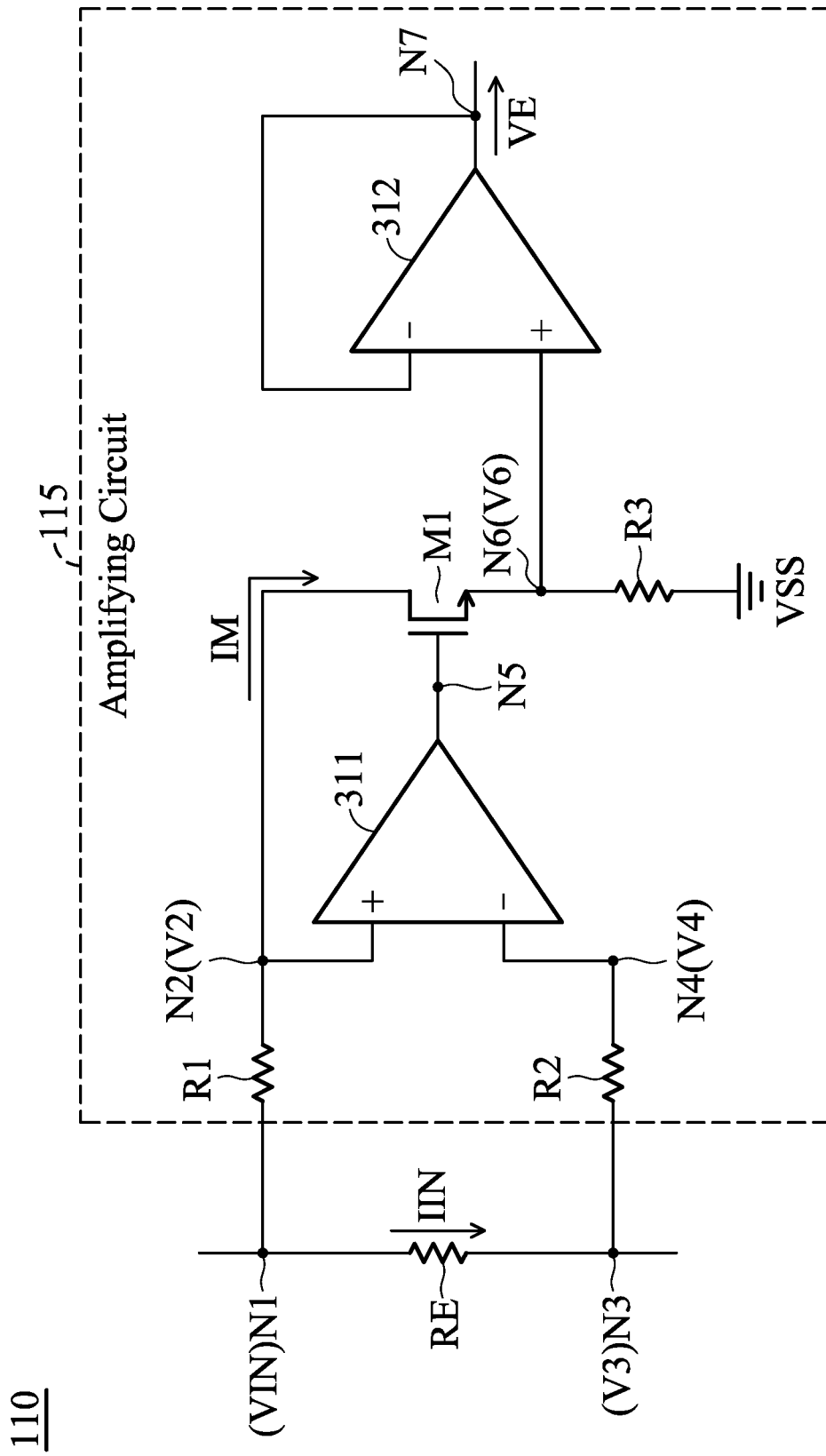
FIG. 3 is a diagram of a sensing circuit according to an embodiment of the invention.

FIG. 3 is a diagram of the sensing circuit 110 according to an embodiment of the invention. In the embodiment of FIG. 3, the sensing circuit 110 includes a sensing resistor RE and an amplifying circuit 115. The input current IIN may flow through the sensing resistor RE. The amplifying circuit 115 can convert the input current IIN into the sensing voltage VE. Specifically, the amplifying circuit 115 includes a first operational amplifier 311, a second operational amplifier 312, a first transistor M1, a first resistor R1, a second resistor R2, and a third resistor R3. The first resistor R1 is coupled between a first node N1 and a second node N2. The first node N1 is arranged for receiving an input voltage VIN relative to the antenna element 190. The second resistor R2 is coupled between a third node N3 and a fourth node N4. The sensing resistor RE is coupled between the first node N1 and the third node N3. The first operational amplifier 311 has a positive input terminal coupled to the second node N2, a negative input terminal coupled to the fourth node N4, and an output terminal coupled to a fifth node N5. The first transistor M1 may be an N-type transistor, such as a NMOS transistor (N-type Metal Oxide Semiconductor Field Effect Transistor). The first transistor M1 has a control terminal coupled to the fifth node N5, a first terminal coupled to a sixth node N6, and a second terminal coupled to the second node N2. The third resistor R3 is coupled between the sixth node N6 and a ground voltage VSS. The second operational amplifier 312 has a positive input terminal coupled to the sixth node N6, a negative input terminal coupled to a seventh node N7, and an output terminal coupled to the seventh node N7 for outputting the sensing voltage VE. It is assumed that the first operational amplifier 311 and the second operational amplifier 312 are both ideal. Based on the negative feedback mechanism, a virtual short is formed between the positive input terminal and the negative input terminal of the first operational amplifier 311, and a unity gain buffer is formed by the second operational amplifier 312. Specifically, the operation principles of the sensing circuit 110 may be described according to the following equations (1) to (5).

$$IIN = \frac{VIN - V3}{RE} \tag{1}$$

$$V2 = V3 = V4 \tag{2}$$

$$IM = \frac{VIN - V2}{R1} = \frac{VIN - V3}{R1} = \left(\frac{RE}{R1}\right) \cdot IIN \tag{3}$$

$$V6 = IM \cdot R3 \tag{4}$$

$$VE = V6 = \left(\frac{R3}{R1}\right) \cdot RE \cdot IIN \tag{5}$$

where "TIN" represents the magnitude of the input current TIN, "VIN" represents the level of the input voltage VIN at the first node N1, "V2" represents the level of a voltage V2 at the second node N2, "V3" represents the level of a voltage V3 at the third node N3, "V4" represents the level of a voltage V4 at the fourth node N4, "V6" represents the level of a voltage V6 at the sixth node N6, "VE" represents the level of the sensing voltage VE at the seventh node N7, "RE" represents the resistance of the sensing resistor RE, "R1" represents the resistance of the first resistor R1, "R3" represents the resistance of the third resistor R3, and "TM" represents the magnitude of the current flowing through the first transistor M1 and the third resistor R3. As mentioned above, the amplifying circuit 115 can amplify the voltage difference between two terminals of the sensing resistor RE so as to generate the sensing voltage VE, and a gain factor of the amplifying circuit 115 may be substantially equal to a resistance ratio (R3/R1) of the third resistor R3 to the first resistor R1.

In some embodiments, the parameter settings of the electronic device 100 are described as follows. According to practical measurements, the input current TIN related to the active antenna 292 may be usually from about 2.5 mA to about 10.5 mA. Accordingly, the lower limit of the input current TIN may be set to 2 mA, and the upper limit of the input current TIN may be set to 12 mA. The resistance of the sensing resistor RE may be about 5Ω. The resistance of the first resistor R1 may be about 100Ω. The resistance of the second resistor R2 may be about 100Ω. The resistance of the third resistor R3 may be about 2000Ω. The gain factor of the amplifying circuit 115 may be about 20 (i.e., 2000/100=20). In response to the aforementioned range of the input current TIN, the lower limit of the sensing voltage VE may be about 0.2V (i.e., 20*5*0.002=0.2), and the upper limit of the sensing voltage VE may be about 1.2V (i.e., 20*5*0.012=1.2). To distinguish the types of the antenna element 190, the first reference voltage VREF1 may be set to 0.2V, and a second reference voltage VREF2 may be set to 1.2V. It should be understood that the above ranges of element parameters are merely exemplary, and in fact, they are adjustable according to different requirements.

Figure 4:
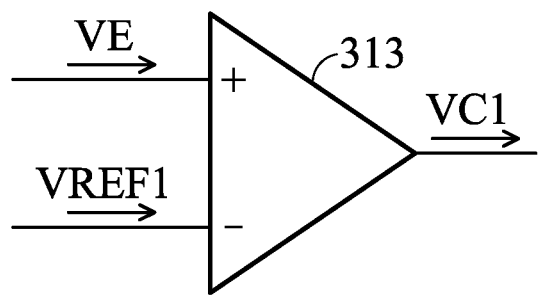
FIG. 4 is a diagram of a comparison circuit according to an embodiment of the invention.

FIG. 4 is a diagram of the comparison circuit 120 according to an embodiment of the invention. In the embodiment of FIG. 4, the comparison circuit 120 includes a third operational amplifier 313. The third operational amplifier 313 has a positive input terminal for receiving the sensing voltage VE, a negative input terminal for receiving the first reference voltage VREF1, and an output terminal for outputting the first control voltage VC1. By analyzing the first control voltage VC1, the electronic device 100 can determine the type of the antenna element 190. For example, if the sensing voltage VE is lower than the first reference voltage VREF1, the first control voltage VC1 may be a low logic level (i.e., the logic "0"), and it may represent that the antenna element 190 is the passive antenna 291 including the DC blocking capacitor CB. Conversely, if the sensing voltage VE is higher than or equal to the first reference voltage VREF1, the first control voltage VC1 may be a high logic level (i.e., the logic "1"), and it may represent that the antenna element 190 is the active antenna 292 including the internal LNA 240.

Figure 5:
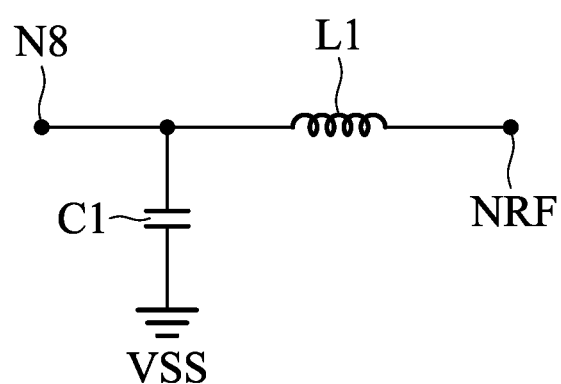
FIG. 5 is a diagram of an interface circuit according to an embodiment of the invention.

FIG. 5 is a diagram of the interface circuit 130 according to an embodiment of the invention. In the embodiment of FIG. 5, the interface circuit 130 includes a capacitor C1 and an inductor L1. The capacitor C1 is coupled between an eighth node N8 and the ground voltage VSS. The inductor L1 is coupled between the eighth node N8 and the RF node NRF. The eighth node N8 is directly or indirectly coupled to the sensing circuit 110. For example, the eighth node N8 may be coupled to the seventh node N7 of the sensing circuit 110, but it is not limited thereto. A low-pass filter is formed by the capacitor C1 and the inductor L1, and it can prevent the electronic device 100 from being interfered with by high-frequency noise of the antenna element 190.

Figure 6:
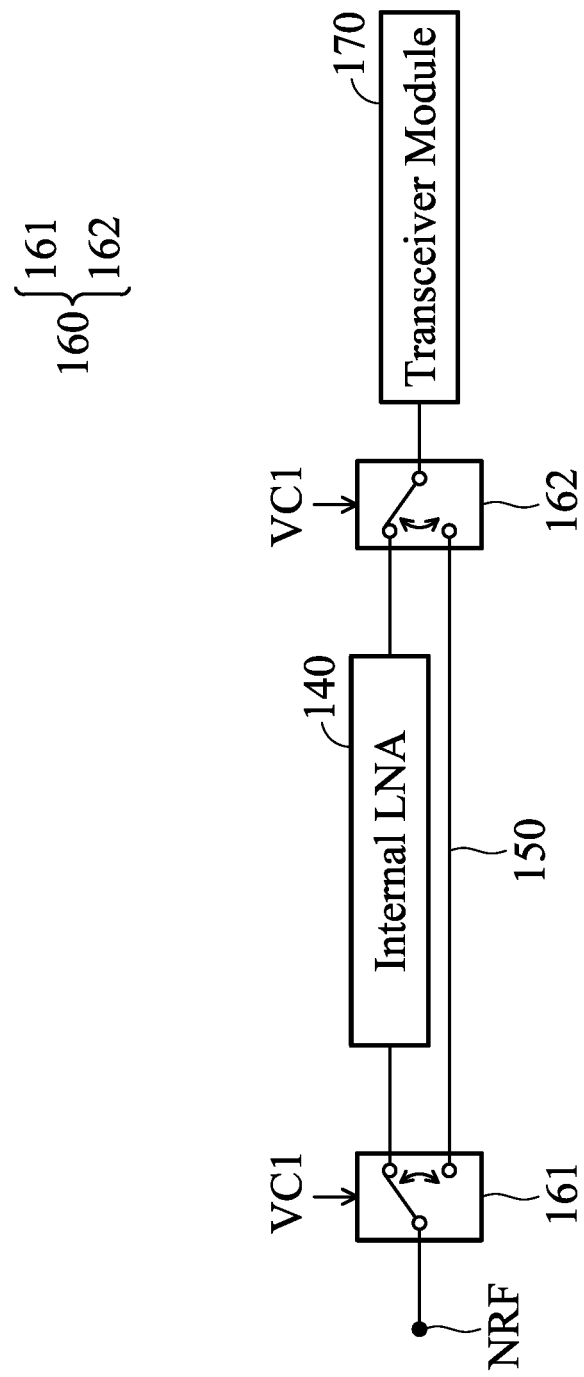
FIG. 6 is a diagram of a selection circuit according to an embodiment of the invention.

FIG. 6 is a diagram of the selection circuit 160 according to an embodiment of the invention. In the embodiment of FIG. 6, the selection circuit 160 includes a first switch element 161 and a second switch element 162. The internal LNA 140 and the bypass path 150 are both disposed between the first switch element 161 and the second switch element 162. Each of the first switch element 161 and the second switch element 162 may be a SPDT (Single Port Double Throw) switch. A terminal of the first switch element 161 is coupled to the RF node NRF, and another terminal of the first switch element 161 is switched between the internal LNA 140 and the bypass path 150 according to the first control voltage VC1. A terminal of the second switch element 162 is coupled to the transceiver module 170, and another terminal of the second switch element 162 is switched between the internal LNA 140 and the bypass path 150 according to the first control voltage VC1. The bypass path 150 may be a simple short-circuited path, and it may be considered as an alternative path when the internal LNA 140 is not used. In addition, the transceiver module 170 of the electronic device 100 may include a band-pass filter, a baseband decoder, a plurality of LNAs, etc. (not shown). Generally, if the sensing voltage VE is lower than the first reference voltage VREF1, both the first switch element 161 and the second switch element 162 may be switched to the internal LNA 140, such that the internal LNA 140 may be coupled to the RF node NRF. Conversely, if the sensing voltage VE is higher than or equal to the first reference voltage VREF1, both the first switch element 161 and the second switch element 162 may be switched to the bypass path 150, such that the bypass path 150 may be coupled to the RF node NRF. Since the active antenna 292 includes the external LNA 240, only the passive antenna 291 needs to use the internal LNA 140 of the electronic device 100.

Figure 7:
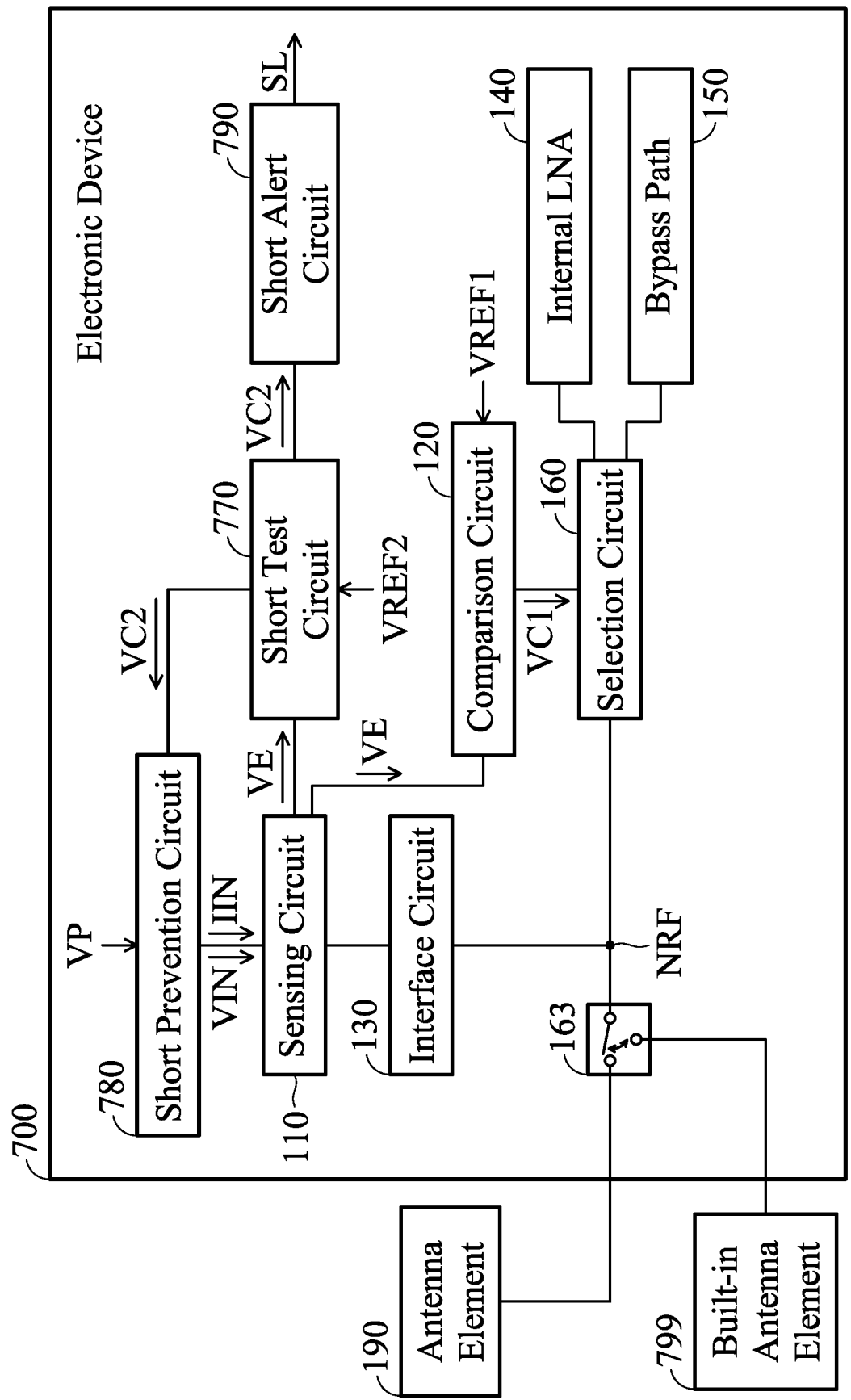
FIG. 7 is a diagram of an electronic device according to another embodiment of the invention.

FIG. 7 is a diagram of an electronic device 700 according to another embodiment of the invention. FIG. 7 is similar to FIG. 1. The main difference between the two embodiments is that the electronic device 700 further includes a short test circuit 770, a short prevention circuit 780, and a short alert circuit 790. The aforementioned three circuits avoid the short-circuited damage occurring in the electronic device 700, and their functions and structures will be described in the following embodiments.

Figure 8:
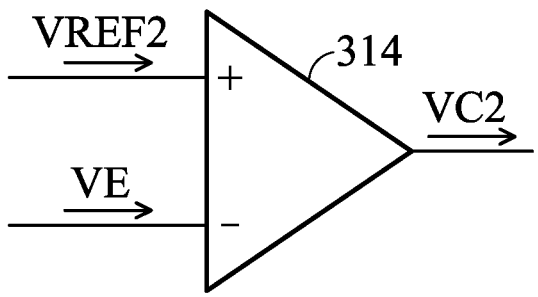
FIG. 8 is a diagram of a short test circuit according to another embodiment of the invention.

FIG. 8 is a diagram of the short test circuit 770 according to another embodiment of the invention. The short test circuit 770 compares the sensing voltage VE with the second reference voltage VREF2, so as to generate a second control voltage VC2. In the embodiment of FIG. 8, the short test circuit 770 includes a fourth operational amplifier 314. The fourth operational amplifier 314 has a positive input terminal for receiving the second reference voltage VREF2, a negative input terminal for receiving the sensing voltage VE, and an output terminal for outputting the second control voltage VC2. It should be noted that the short-circuited damage of the electronic device 700 often results from the passive antenna 293, without any DC blocking capacitor CB, being coupled thereto. The passive antenna 293 usually has a very large operating current. By analyzing the second control voltage VC2, the electronic device 700 can determine the type of the antenna element 190 and avoid the short-circuited event occurring. For example, if the sensing voltage VE is lower than or equal to the second reference voltage VREF2, the second control voltage VC2 may be a high logic level, and it may represent that the antenna element 190 is the passive antenna 291 including the DC blocking capacitor CB or the active antenna 292 including the external LNA 240 (i.e., the electronic device 700 operates in a normal mode). Conversely, if the sensing voltage VE is higher than the second reference voltage VREF2, the second control voltage VC2 may be a low logic level, and it may represent that the antenna element 190 is the passive antenna 293 without any DC blocking capacitor CB (i.e., the short-circuited event occurs in the electronic device 700).

In conclusion, the relationship between the sensing voltage VE and the type of the antenna element 190 may be as the following Table I:

TABLE I

| Sensing Voltage | Type Of Antenna Element |
| --- | --- |
| Lower Than First Reference Voltage | Passive Antenna Including DC Blocking Capacitor |
| Between First Reference Voltage And Second Reference Voltage | Active Antenna Including External LNA |
| Higher Than Second Reference Voltage | Passive Antenna Without Any DC Blocking Capacitor |

Figure 9:
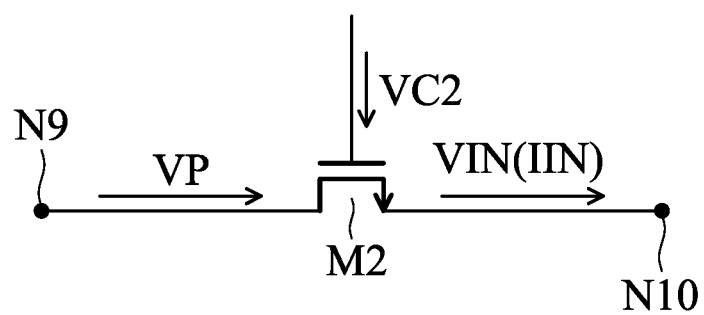
FIG. 9 is a diagram of a short prevention circuit according to another embodiment of the invention.

FIG. 9 is a diagram of the short prevention circuit 780 according to another embodiment of the invention. The short prevention circuit 780 determines whether to couple a ninth node N9 to a tenth node N10 according to the second control voltage VC2. The ninth node N9 is arranged for receiving a system power voltage VP relative to the antenna element 190. The system power voltage VP may be directly or indirectly from the operation voltage of the antenna element 190. Alternatively, the system power voltage VP may be almost in proportion to the operation voltage of the antenna element 190. The tenth node N10 may be directly or indirectly coupled to the first node N1 of the sensing circuit 110. Thus, the tenth node N10 is arranged for selectively outputting the input voltage VIN and the input current IIN to the sensing circuit 110. In the embodiment of FIG. 9, the short prevention circuit 780 includes a second transistor M2. The second transistor M2 may be an N-type transistor, such as an NMOS transistor. The second transistor M2 has a control terminal for receiving the second control signal VC2, a first terminal coupled to the tenth node N10, and a second terminal coupled to the ninth node N9. If the sensing voltage VE is lower than or equal to the second reference voltage VREF2, the second transistor M2 of the short prevention circuit 780 may operate in a closed state, so as to enable the input voltage VIN and the input current TIN of the sensing circuit 110. Conversely, if the sensing voltage VE is higher than the second reference voltage VREF2, the second transistor M2 of the short prevention circuit 780 may operate in an open state, so as to disable the input voltage VIN and the input current IIN of the sensing circuit 110. The incorporation of the short prevention circuit 780 can prevent the exceeding input voltage VIN and the exceeding input current IIN from entering the sensing circuit 110, thereby protecting the electronic device 100 from being damaged.

Figure 10:
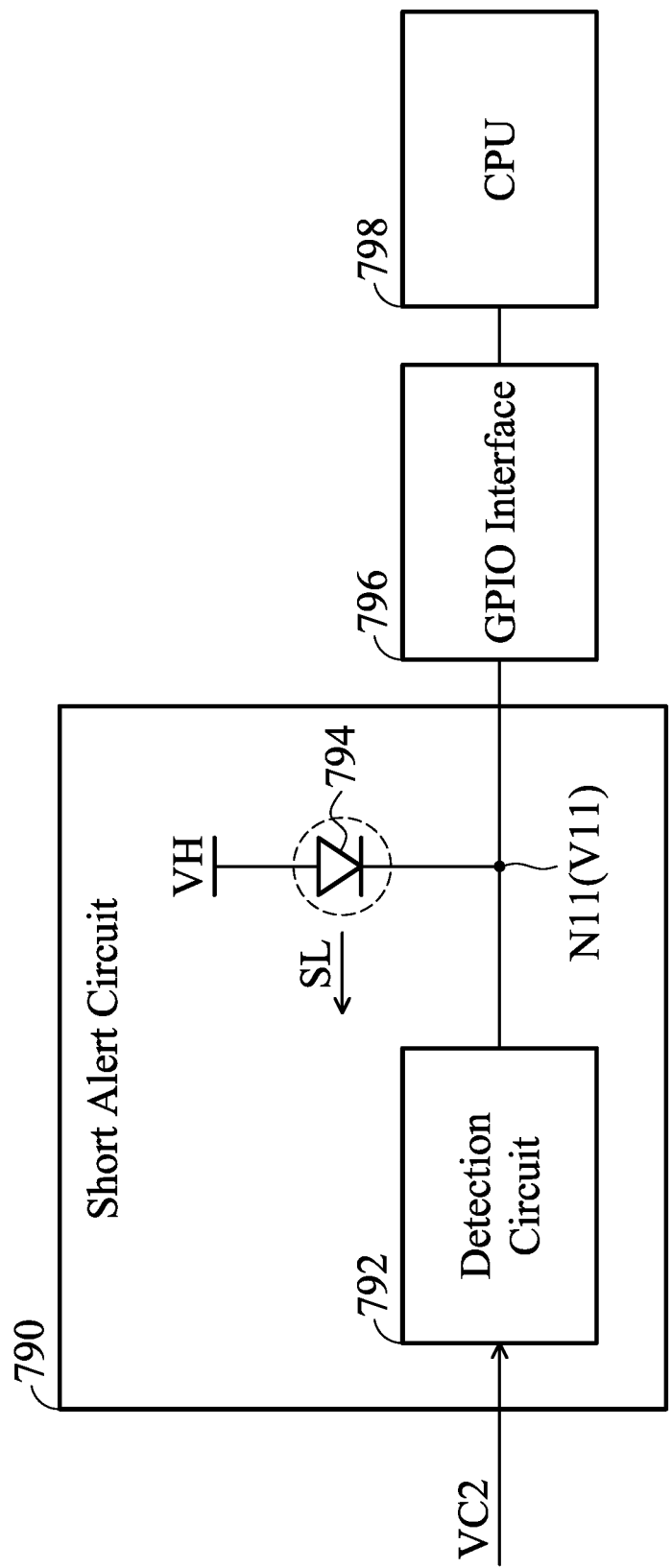
FIG. 10 is a diagram of a short alert circuit according to another embodiment of the invention.

FIG. 10 is a diagram of the short alert circuit 790 according to another embodiment of the invention. The short alert circuit 790 determines whether to generate an alerting signal SL according to the second control voltage VC2. In the embodiment of FIG. 10, the short alert circuit 790 includes a detection circuit 792 and an LED (Light-Emitting Diode) 794. The alerting signal SL may be a flashing signal. The detection circuit 792 monitors the second control voltage VC2, and determines whether to pull down a voltage V11 at an eleventh node N11 according to the second control voltage VC2. The LED 794 selectively generates the alerting signal SL. The LED 794 has an anode coupled to a high voltage VH, and a cathode coupled to the eleventh node N11. If the second control voltage VC2 transitions from a high logic level to a low logic level, the detection circuit 792 may pull down the level of the voltage V11 of the eleventh node N11, so as to enable the LED 794 and generate the alerting signal SL; otherwise, the voltage V11 of the eleventh node N11 may be maintained at a high logic level, and the LED 794 may not generate any alerting signal SL. The alerting signal SL alerts a user to note the risk of the short-circuited damage occurring in the electronic device 100. In some embodiments, the eleventh node N11 is further coupled through a GPIO (General-Purpose Input/Output) interface 796 to a CPU (Central Processing Unit) 798, such that the CPU 798 performs other operations to prevent the electronic device 100 from being damaged according to the voltage V11 at the eleventh node N11.

In some embodiments, the electronic device 700 further includes a third switch element 163, and the mobile device integrated with the electronic device 700 further includes a built-in antenna element 799. The built-in antenna element 799 may be a passive antenna including a DC blocking capacitor (as shown in FIG. 2A). The third switch element 163 may switch between the (external) antenna element 190 and the built-in antenna element 799. For example, the third switch element 163 may be a SPDT switch which is operated according to an instruction from the CPU 798. Alternatively, the third switch element 163 may be a mechanical push switch which is operated by a finger of the user. For example, when the mechanical push switch has not been pressed, the third switch element 163 may couple the RF node NRF to the built-in antenna element 799, and when the mechanical push switch has been pressed, the third switch element 163 may couple the RF node NRF to the (external) antenna element 190. In alternative embodiments, adjustments are made such that the built-in antenna element 799 is disposed inside the electronic device 700. It should be noted that the third switch element 163 and the built-in antenna element 799 are optional elements, and they are omitted in other embodiments.

The invention proposes a novel electronic device for automatically adjusts relative setting values according to the type of an antenna element coupled thereto, so as to optimize the communication quality of the electronic device. Generally, the invention has at least the advantages of simple structures and low manufacturing costs, and therefore it is suitable for application in a variety of mobile communication devices.

Note that the above voltages, currents, resistances, inductances, capacitances and other element parameters are not limitations of the invention. A designer can adjust these parameters according to different requirements. The electronic device of the invention is not limited to the configurations of FIGS. 1-10. The invention may merely include any one or more features of any one or more embodiments of FIGS. 1-10. In other words, not all of the features displayed in the figures should be implemented in the electronic device of the invention. Although the embodiments of the invention use MOSFETs as examples, the invention is not limited thereto, and those skilled in the art may use other types of transistors such as BJT (Bipolar Junction Transistors), JFET (Junction Gate Field Effect Transistor), FinFET (Fin Field Effect Transistor), etc.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device for detecting an antenna element, comprising:
   a sensing circuit, generating a sensing voltage according to an input current, wherein the input current is relative to the antenna element;
   a comparison circuit, comparing the sensing voltage with a first reference voltage, so as to generate a first control voltage;
   an interface circuit, wherein the sensing circuit is coupled through the interface circuit to an RF (Radio Frequency) node, and the interface circuit is configured to reduce interference between the antenna element and the electronic device;
   an internal LNA (Low Noise Amplifier);
   a bypass path; and
   a selection circuit, selectively coupling the internal LNA or the bypass path to the RF node according to the first control voltage;
   wherein the sensing circuit comprises a sensing resistor and an amplifying circuit, and the input current flows through the sensing resistor;
   wherein the amplifying circuit comprises:
   a first resistor, coupled between a first node and a second node;
   a second resistor, coupled between a third node and a fourth node, wherein the sensing resistor is coupled between the first node and the third node;
   a first operational amplifier, wherein the first operational amplifier has a positive input terminal coupled to the second node, a negative input terminal coupled to the fourth node, and an output terminal coupled to a fifth node;
   a first transistor, wherein the first transistor has a control terminal coupled to the fifth node, a first terminal coupled to a sixth node, and a second terminal coupled to the second node;
   a third resistor, coupled between the sixth node and a ground voltage; and
   a second operational amplifier, wherein the second operational amplifier has a positive input terminal coupled to the sixth node, a negative input terminal coupled to a seventh node, and an output terminal coupled to the seventh node for outputting the sensing voltage.

2. The electronic device as claimed in claim 1, wherein the first transistor is an NMOS transistor (N-type Metal Oxide Semiconductor Field Effect Transistor).

3. The electronic device as claimed in claim 1, wherein the comparison circuit comprises:
   a third operational amplifier, wherein the third operational amplifier has a positive input terminal for receiving the sensing voltage, a negative input terminal for receiving the first reference voltage, and an output terminal for outputting the first control voltage.

4. The electronic device as claimed in claim 1, wherein the interface circuit comprises:
   a capacitor, coupled between an eighth node and a ground voltage; and
   an inductor, coupled between the eighth node and the RF node, wherein the eighth node is coupled to the sensing circuit.

5. The electronic device as claimed in claim 1, wherein if the sensing voltage is lower than the first reference voltage, the selection circuit couples the internal LNA to the RF node, and if the sensing voltage is higher than or equal to the first reference voltage, the selection circuit couples the bypass path to the RF node.

6. The electronic device as claimed in claim 1, wherein the selection circuit comprises:
   a first switch element, coupled to the RF node; and
   a second switch element, coupled to a transceiver module, wherein each of the first switch element and the second switch element switches between the internal LNA and the bypass path.

7. The electronic device as claimed in claim 1, further comprising:
   a short test circuit, comparing the sensing voltage with a second reference voltage, so as to generate a second control voltage.

8. The electronic device as claimed in claim 7, wherein the short test circuit comprises:
   a fourth operational amplifier, wherein the fourth operational amplifier has a positive input terminal for receiving the second reference voltage, a negative input terminal for receiving the sensing voltage, and an output terminal for outputting the second control voltage.

9. The electronic device as claimed in claim 7, further comprising:
   a short prevention circuit, determining whether to couple a ninth node to a tenth node according to the second control voltage, wherein the ninth node is arranged for receiving a system power voltage relative to the antenna element, and the tenth node is arranged for selectively outputting an input voltage and the input current to the sensing circuit.

10. The electronic device as claimed in claim 9, wherein if the sensing voltage is lower than or equal to the second reference voltage, the short prevention circuit operates in a closed state, and if the sensing voltage is higher than the second reference voltage, the short prevention circuit operates in an open state.

11. The electronic device as claimed in claim 9, wherein the short prevention circuit comprises:
   a second transistor, wherein the second transistor has a control terminal for receiving the second control voltage, a first terminal coupled to the tenth node, and a second terminal coupled to the ninth node.

12. The electronic device as claimed in claim 11, wherein the second transistor is an NMOS transistor.

13. The electronic device as claimed in claim 7, further comprising:
   a short alert circuit, determining whether to generate an alerting signal according to the second control voltage.

14. The electronic device as claimed in claim 13, wherein the short alert circuit comprises:
   a detection circuit, monitoring the second control voltage, and determining whether to pull down a voltage at an eleventh node according to the second control voltage; and
   an LED (Light-Emitting Diode), selectively generating the alerting signal, wherein the LED has an anode coupled to a high voltage, and a cathode coupled to the eleventh node.

15. The electronic device as claimed in claim 14, wherein the eleventh node is further coupled through a GPIO (General-Purpose Input/Output) interface to a CPU (Central Processing Unit).

16. The electronic device as claimed in claim 1, wherein the antenna element is a passive antenna comprising a DC (Direct Current) blocking capacitor.

17. The electronic device as claimed in claim 1, wherein the antenna element is an active antenna comprising an external LNA.

18. The electronic device as claimed in claim 1, wherein the antenna element is a passive antenna without any DC blocking capacitor.

* * * * *